(12) United States Patent
Li et al.

(10) Patent No.: US 7,883,375 B2
(45) Date of Patent: Feb. 8, 2011

(54) DUAL-PORT ELECTRICAL ADAPTOR

(75) Inventors: Xiao-Li Li, Kunshan (CN); Ping-Sheng Su, Tu-Cheng (TW)

(73) Assignee: Hon Hai Precision Inc. Co., Ltd., Taipei Hsien (TW)

( * ) Notice: Subject to any disclaimer, the term of this patent is extended or adjusted under 35 U.S.C. 154(b) by 119 days.

(21) Appl. No.: 12/384,747

(22) Filed: Apr. 8, 2009

(65) Prior Publication Data

US 2009/0253302 A1 Oct. 8, 2009

(30) Foreign Application Priority Data

Apr. 8, 2008 (CN) .................... 2008 2 0035025 U

(51) Int. Cl.
*H01R 13/66* (2006.01)
(52) U.S. Cl. ................................. 439/620.24
(58) Field of Classification Search ............ 439/620.24, 439/76.1, 493, 489, 557
See application file for complete search history.

(56) References Cited

U.S. PATENT DOCUMENTS

| 5,182,450 | A * | 1/1993 | Pan ............................ 250/234 |
| 6,945,816 | B1 * | 9/2005 | Wu ............................. 439/545 |
| 7,568,940 | B2 * | 8/2009 | Cheng et al. ................. 439/489 |
| 7,632,148 | B1 * | 12/2009 | Kawamura et al. ...... 439/607.41 |
| 2006/0110962 | A1 * | 5/2006 | Powell et al. ................ 439/169 |
| 2008/0070433 | A1 * | 3/2008 | Zeigler ........................ 439/206 |

FOREIGN PATENT DOCUMENTS

CN 2877089 3/2007

* cited by examiner

*Primary Examiner*—Jean F Duverne
(74) *Attorney, Agent, or Firm*—Ming Chieh Chang; Wei Te Chung; Andrew C. Cheng

(57) ABSTRACT

An electrical adaptor (100) includes a first connection assembly (2) having a first printed circuit board (20), a first connector (21) mounted to a front segment of the first printed circuit board, a first variable resistor (24) mounted to a rear segment of the first printed circuit; a second connection assembly (3) having a second printed circuit board (30), a second connector (31) mounted to a front segment of the second printed circuit board, a second variable resistor (34) mounted to a rear segment of the first printed circuit board; a cover member (1, 6) enclosing the first connection assembly and the second connection assembly therein; and wherein the first printed circuit board and the second printed circuit board are disposed at different levels and partially overlapping each other.

14 Claims, 6 Drawing Sheets

US 7,883,375 B2

DUAL-PORT ELECTRICAL ADAPTOR

BACKGROUND OF THE INVENTION

1. Field of the Invention

The present invention generally relates to an electrical connector, and more particularly to a dual-port electrical adaptor.

2. Description of Related Art

As development of an electronic technology, an electronic device becomes more lower profile and multi-functional. For some consumer electronic products, such as an audio device has an electrical adaptor equipped with two and more ports coupled to extension wires that further connected to earphones or speakers, thus more people may enjoy music of the audio device simultaneously. However, the electrical adaptor may also have two or more sets of connection assemblies, and each of the connection assemblies includes a number of electronic elements that may occupy much room if they are not well arranged, so that the overall dimension of the electrical adaptor may increase, which brings inconvenience to a customer.

Hence, an electrical adaptor is highly desired to overcome the aforementioned problems.

SUMMARY OF THE INVENTION

Accordingly, an object of the present invention is to provide a lower profile dual-port electrical adaptor.

In order to achieve the object set forth, an electrical adaptor in accordance with the present invention comprises a first connection assembly including a first printed circuit board, a first connector mounted to a front segment of the first printed circuit board, a first variable resistor mounted to a rear segment of the first printed circuit board; a second connection assembly including a second printed circuit board, a second connector mounted to a front segment of the second printed circuit board, a second variable resistor mounted to a rear segment of the first printed circuit board; a cover member enclosing the first connection assembly and the second connection assembly therein; and wherein the first printed circuit board and the second printed circuit board are disposed at different levels and partially overlapping each other.

Other objects, advantages and novel features of the invention will become more apparent from the following detailed description when taken in conjunction with the accompanying drawings.

DETAILED DESCRIPTION OF THE INVENTION

Reference will now be made in detail to the preferred embodiment of the present invention.

Figure 1:
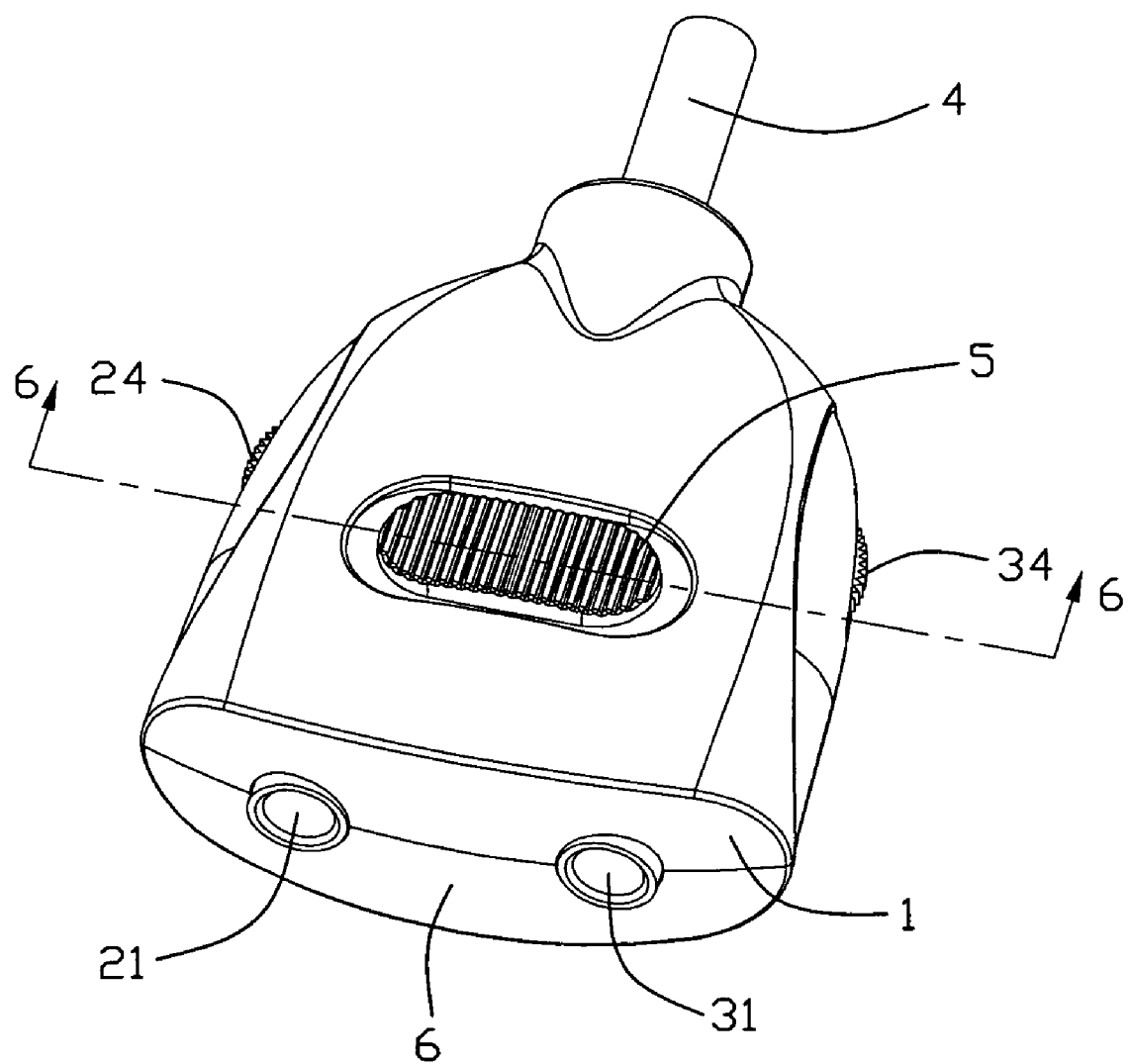
FIG. 1 is an assembled, perspective view of an electrical adaptor in accordance with the present invention.
Figure 2:
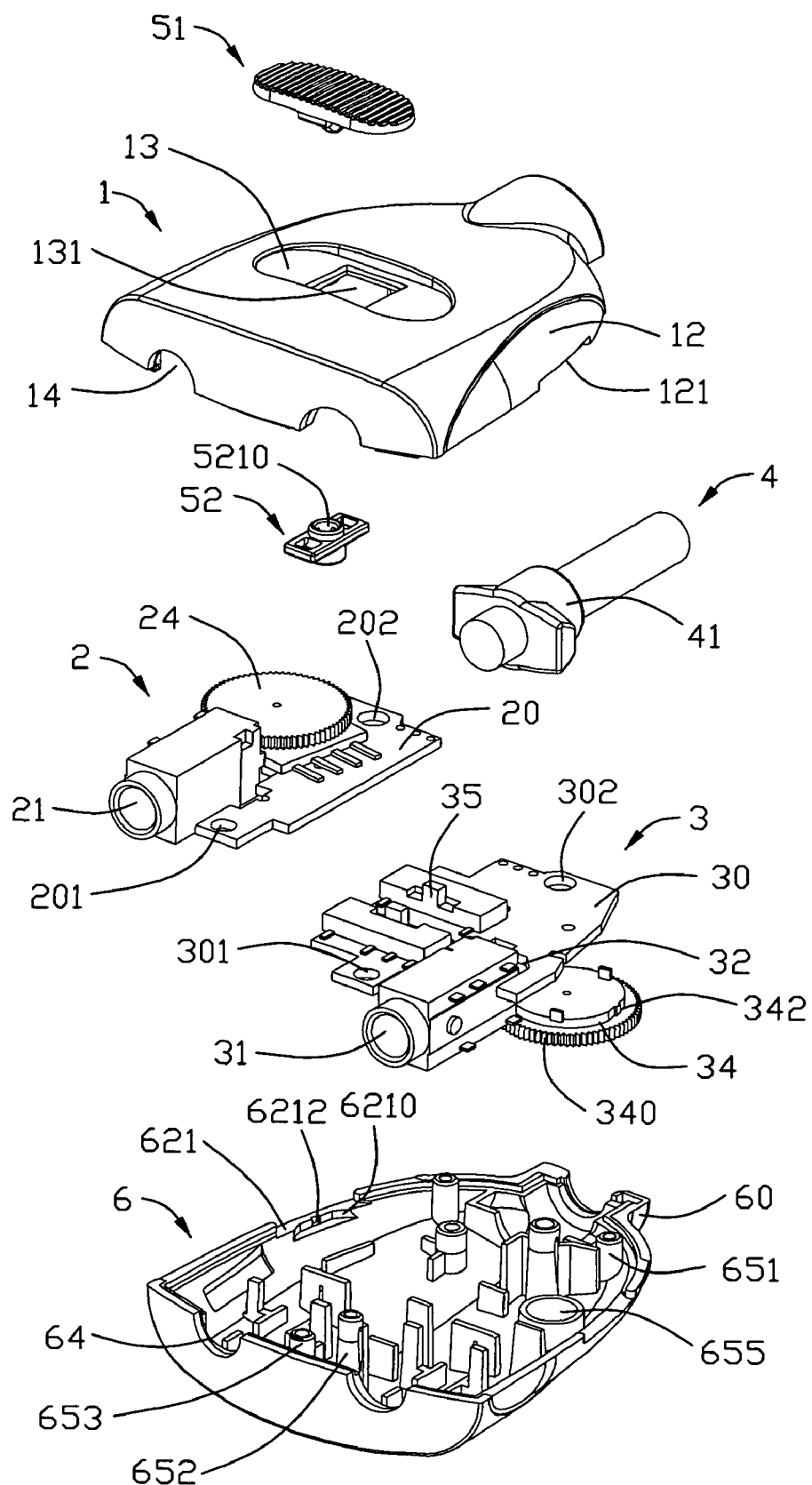
FIG. 2 is an exploded, perspective view of the electrical adaptor.
Figure 3:
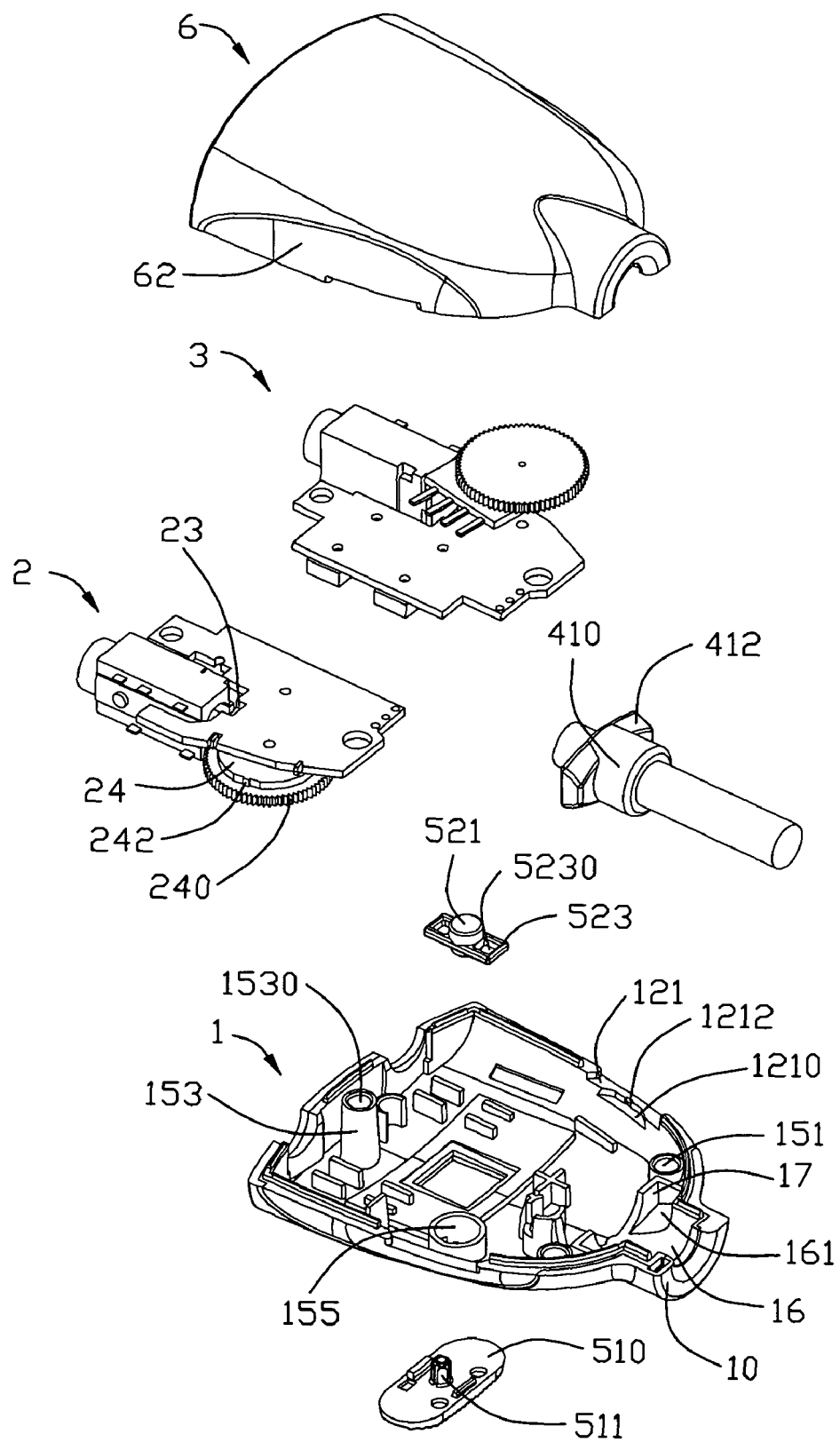
FIG. 3 is similar to FIG. 2, but viewed from another aspect.
Figure 4:
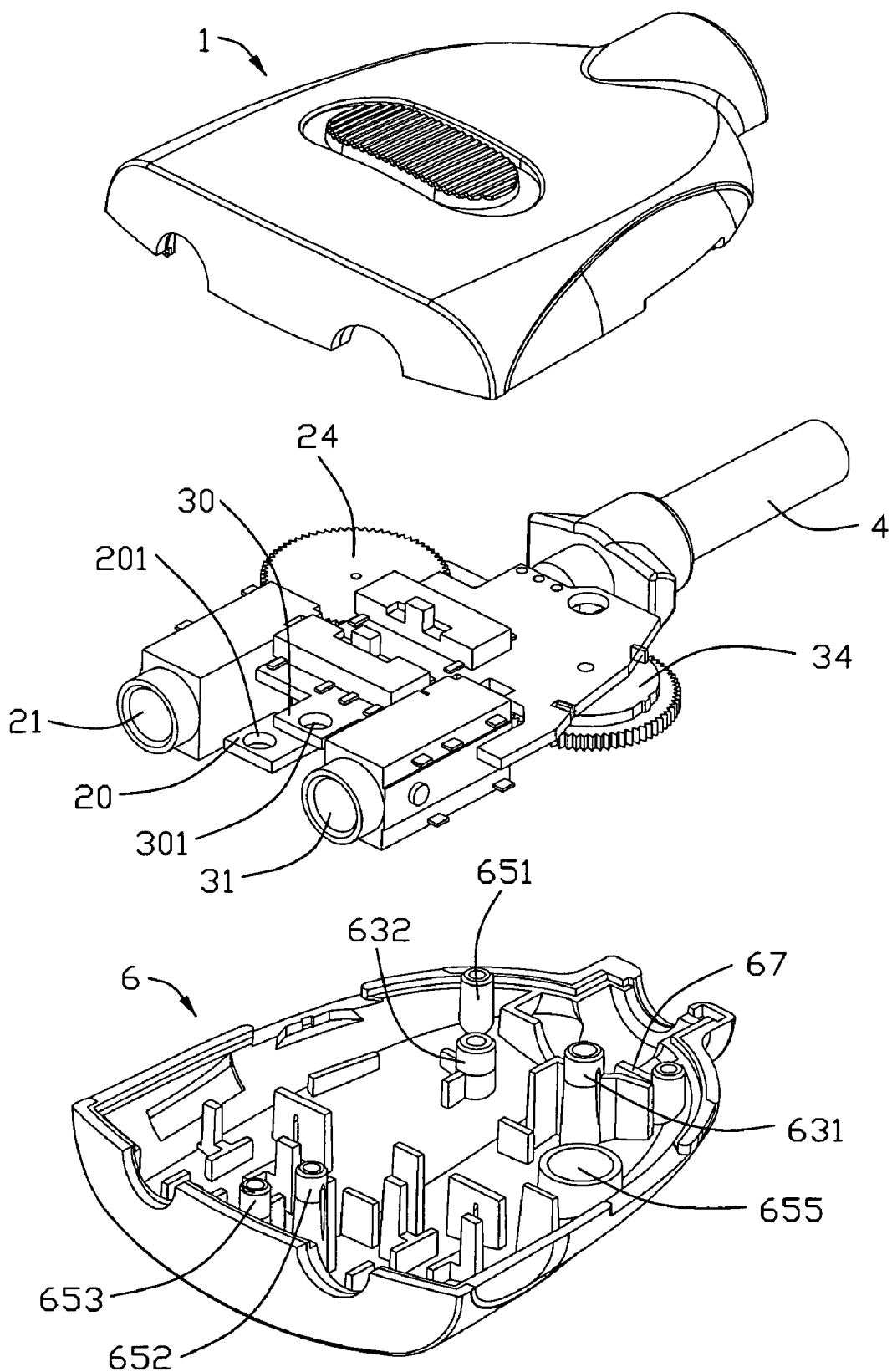
FIG. 4 is partially exploded, perspective view of the electrical adaptor.
Figure 5:
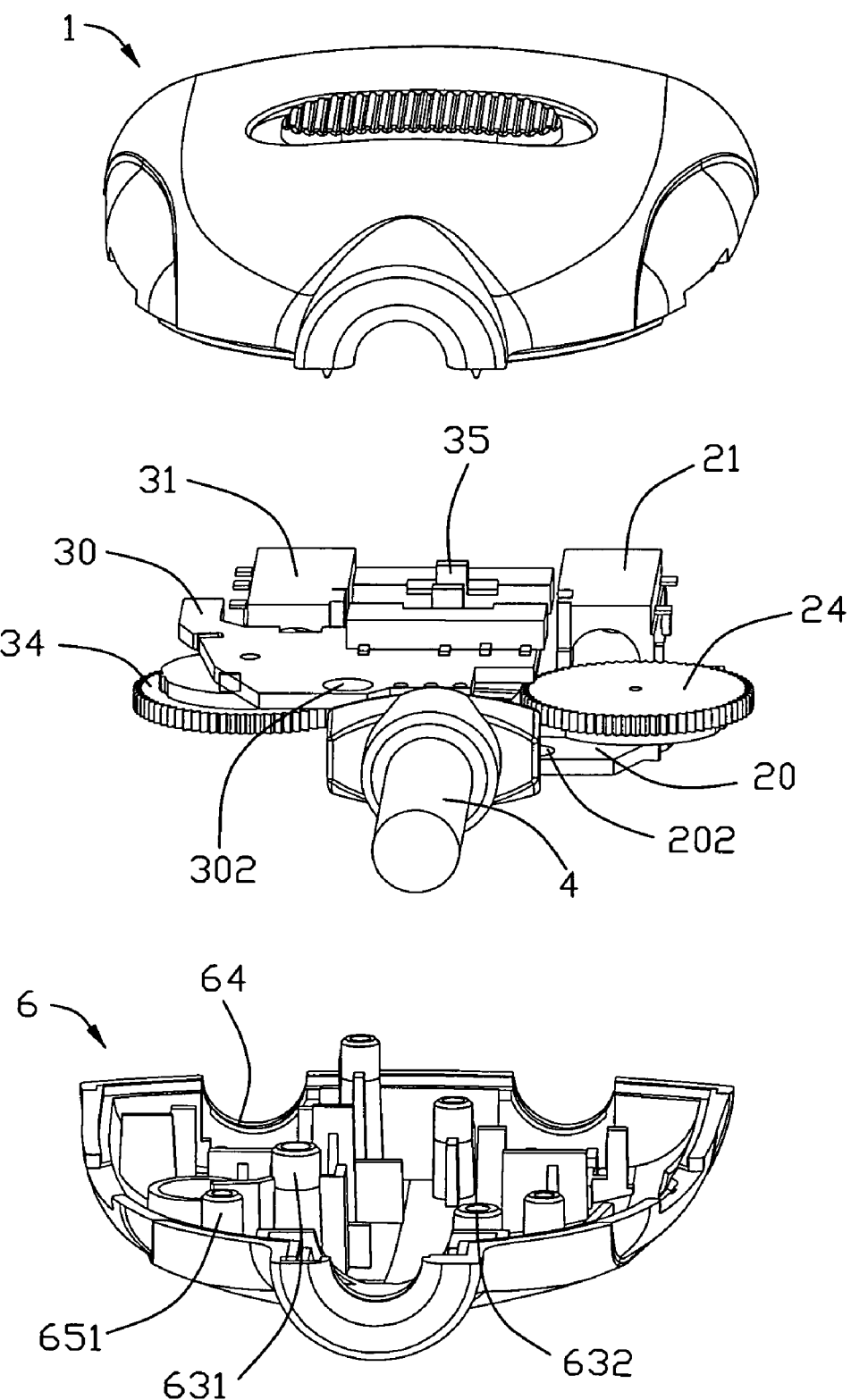
FIG. 5 is similar to FIG. 4, but viewed from other direction.
Figure 6:
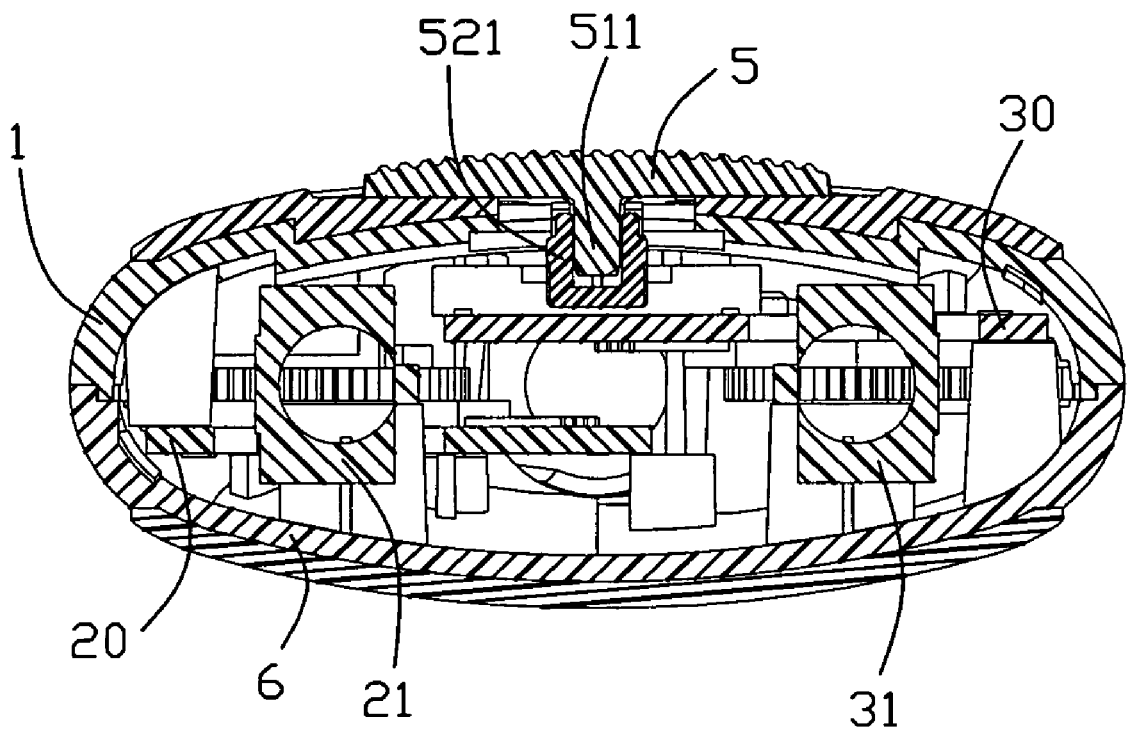
FIG. 6 is a cross-section view of FIG. 1 taken along line 6-6.

Referring to FIGS. 1-3, an electrical adaptor 100 in accordance with the present invention comprises an upper cover 1, a first connection assembly 2, a second connection assembly 3, a cable 4 connected to the first and second connection assemblies 2, 3, and a bottom cover 6 cooperating with the upper cover 1 to enclose the first and second connection assemblies 2, 3 therein.

Referring to FIGS. 2-5, the upper cover 1 and the bottom cover 6 are manufactured by two-step molding process, i.e. the inner sections thereof are firstly molded, and then peripheral sections thereof are molded. Taken the upper cover 1 as an example, as there is minor difference between the inner section and the peripheral section, and two first operation areas 12 are projected outwardly from lateral parts thereof. Two first recesses 121 are respectively defined in lower portions of the first operation areas 12. A groove 1210 is recessed upwardly from an upper surface of the first recess 121 which is arranged leftward, and a notch 1212 is recessed upwardly from the upper surface of the first recess 121, arranged aside the groove 1210 and further in communication to the groove 1210. A cavity 13 is defined in a top side of the upper cover 1, and a rectangular shaped slot 131 is recessed downwardly from middle segment of a bottom surface of the cavity 13 and communicating with internal of the upper cover 1. Two semicircular openings 14 are spaced apart one another and defined in a front side of the upper cover 1, and an extension portion 10 protrudes backward from a rear side of the upper cover 1. A passageway 16 extends along the extension portion 10 and communicates with the internal of the upper cover 1. A spacer 17 is located in the internal of the upper cover 1 and disposed in front of the extension portion 10, and a retaining cavity 161 is arranged at back side of the spacer 17. Two cylindrical posts 151 are arranged in front of and adjacent the spacer 17. Another post 153 is located behind the front side of the upper cover 1, with a hole 1530 defined therein. The post 153 is higher than the two cylindrical posts 151. A first supporter 155 is arranged next to the first recess 121 which is arranged rightward of the upper cover 1.

The first connection assembly 2 includes a first printed circuit board (PCB) 20, a first connector 21 mounted to the front segment of the first PCB 20, a first adjustable resistor 24 mounted to the rear segment of the first PCB 20 and disposed behind the first connector 21. A first cutout 23 is defined in the right side of the front segment of the first PCB 20, with the rear portion of the first connector 21 located therein, and the front portion of the first connector 21 extending beyond a front edge of the first PCB 20. The variable resistor 24 includes a rotational wheel 240. An peripheral edge of the rotational wheel 240 extends beyond the right edge of the first PCB 20, and a volume output of the first connector 21 can be controlled by varying a value of the variable resistor 24 via turning the rotational wheel 240. A first mounting hole 201 is defined in the front segment of the first PCB 20, and a second mounting hole 202 is defined in the rear segment of the first PCB 20.

The second connection assembly 3 is similar to the first connection assembly 2. A third mounting hole 301 is defined in the front segment of a second PCB 30, and the fourth mounting hole 302 is defined in the rear segment of the second PCB 30. Compared with the first connection assembly 2, a second cutout 32 is defined in the left side of the second PCB 30 to accommodate a second connector 31 therein. A second variable resistor 34 is mounted to a bottom surface of the second PCB 30 and disposed behind the second connector 21. The second variable resistor 34 also has a rotational wheel 340 for adjusting a value thereof. An peripheral edge of the rotational wheel 340 extends beyond the left edge of the second PCB 30. Two sliding members 35 are mounted on the up surface of the second PCB 30 and slidable along left-to-right direction.

A strain relief member 41 is attached to a front portion of the cable 4. The strain relief member 41 includes a body portion 410 combined with the cable 4 and two protrusion portions 412 formed at lateral sides of the body portion 410.

Referring to FIGS. 2-3, a switch device 5 includes a button member 51 and a connection member 52. The button member 51 has a pushing portion 510 and a post portion 511 extending downwardly from the pushing portion 510. The connection member 52 has a frame portion 523, cylindrical shaped post 521 located in the middle section of the frame portion 523 and extending beyond a top and bottom surfaces of the frame portion 523. A slot 5210 is recessed downwardly from a top surface of the post portion 511. Two cavities 5230 are respectively formed in the front and back sections of the frame portion 523.

The bottom cover 6 is similar to the upper cover 1, and two second operation areas 62 corresponding the first operation areas 12 are projected outwardly from lateral parts of the bottom cover 6. Two semi-circular openings 64 are spaced apart from one another and defined in a front side of the bottom cover 6. Two second recesses 621 aligning with the first recesses 121 are defined in an upper portion of the second operation areas 62. A groove 6210 is recessed downwardly from a bottom surface of the second recess 621 arranged rightward, and a notch 6212 is recessed downwardly from the bottom surface of the second recess 621, arranged aside the groove 6210 and further in communication to the groove 6210. Two posts 651 corresponding to the cylindrical posts 151 are arranged in the internal of the bottom cover 6. A first mounting post 652 is located in the front section of the internal of the bottom cover 6, and a second mounting post 653 is lower than the first mounting post 652 and disposed rightward of the first mounting post 652. A third mounting post 631 is located in the back section of the internal of the bottom cover 6, and a fourth mounting post 632 is lower than the third mounting post 631 and located rightward of the third mounting post 631. A spacer 67 is arranged behind the third and fourth mounting posts 631, 632. A second supporter 655 is arranged next to the second recess 621 that defined in the leftward of the bottom cover 6.

Referring to FIGS. 2-5, when assembling, the cable 4 are soldered to the first and second PCBs 20, 30. The first and second connection assemblies 2, 3 are mounted to the bottom cover 6, with the second mounting post 653 inserted into the first mounting hole 201, the fourth mounting post 632 inserted into the second mounting hole 202 of the first PCB 20. The first connector 21 is disposed in the corresponding opening 64. The first mounting post 652 is inserted into the third mounting hole 301, and the third mounting post 631 is inserted into the fourth mounting hole 302 of the second PCB 30. The second connector 31 is disposed in the other opening 64. The second variable resistor 34 is lain on the second supporter 655. The second PCB 30 is located higher than and partially overlapping with the first PCB 20. The rotational wheels 240, 340 of the first and second variable resistors 24, 34 are disposed at substantially same level, and partial of the rotational wheels 240, 340 exposed outside of the bottom cover 6 through the second recesses 621. The upper cover 1 is assembled to the bottom cover 6, with protrusions (not numbered) formed on the sliding members 35 inserted into cavities 5230 in the frame portion 523 of the connection member 52. The button member 51 is mounted to the upper cover 1, with the pushing portion 510 accommodated in the cavity 13 in the upper cover 1, the post portion 511 passing the slot 131 below the cavity 13 and inserted into the slot 5210 in the post 521. The first connector 21 and the second connector 31 are retained in the openings 14, 64. The first variable resistor 24 is partially received in the groove 6210, with a tiny tab 242 thereon engaging with the notch 6212. The second variable resistor 34 is partially received in the groove 1210, with a tiny tab 342 thereon engaging with the notch 1212. The rotational wheel 240 of the first variable resistor 24 relies against the first supporter 155. The body portion 410 of the strain relief member 41 is accommodated in the passageway 16 of the extension portion 10, and the two protrusion portions 412 are received in the retaining cavity 161. The posts 651 are received in the cylindrical posts 151 of the upper cover 1.

When the button member 51 is located in the middle section of the cavity 13, electrical signals of the first connector 21 and the second connector 31 are being "on" status, thus signals outputs therein are available; when the button member 51 is moved left to actuate the sliding members 35 moving leftward, the signal in first connector 21 is located in "off" status, and the signal of the second connector 31 is located in "on" status; when the button member 51 is moved right, the signal of the first connector 21 is located in "on" status, and the signal of the second connector 31 is located in "off" status.

A connector (not shown) may coupled to an end of the cable 4, and the strain relief member 41 may sandwiched between the extension portion 10 of the upper cover 1 and corresponding extension portion 60 of the lower cover 6. The connector may mate with port of audio/video device. The first connector 21 and the second connector 31 may couple with two earphones or speakers via complementary connectors.

It is to be understood, however, that even though numerous characteristics and advantages of the present invention have been set forth in the foregoing description, together with details of the structure and function of the invention, the disclosure is illustrated only, and changes may be made in detail, especially in matters of shape, size, and arrangement of parts within the principles of the invention to the full extent indicated by the broad general meaning of the terms in which the appended claims are expressed.

What is claimed is:

1. An electrical adaptor comprising:
   a first connection assembly including a first printed circuit board, a first connector mounted to a front segment of the first printed circuit board, a first variable resistor mounted to a rear segment of the first printed circuit board;
   a second connection assembly including a second printed circuit board, a second connector mounted to a front segment of the second printed circuit board, a second variable resistor mounted to a rear segment of the first printed circuit board;
   a cover member enclosing the first connection assembly and the second connection assembly therein; and
   wherein the first printed circuit board and the second printed circuit board are disposed at different levels and partially overlapping each other; wherein the first variable resistor is located above the first printed circuit board and the second variable resistor is located below the second printed circuit board; wherein the first variable resistor has a rotational wheel partially projecting outside via a recess defined in a lateral side of the cover member, and the second variable resistor has a rotational wheel partially projecting outside via another recess defined in another lateral side of the cover member; wherein the rotational wheel of the first variable resistor and the rotational wheel of the second variable resistor are substantially disposed at same level.

2. The electrical adaptor as claimed in claim 1, wherein the first connector is partially accommodated in a cutout defined in the front segment of the first printed circuit board, and the second connector is partially accommodated in a cutout defined in the front segment of the second printed circuit board.

3. The electrical adaptor as claimed in claim 1, wherein the first connector and the second connector are spaced apart from each other and disposed at same level.

4. The electrical adaptor as claimed in claim 1, wherein the first printed circuit board has two mounting holes defined in front and rear portions thereof to engage with corresponding mounting posts formed in the cover member, and the second circuit board has two mounting holes defined in front and rear portions thereof to engage with corresponding posts formed in the cover member.

5. The electrical adaptor as claimed in claim 1, further comprising two sliding members supported by one of the printed circuit boards and disposed adjacent a top side of the cover member.

6. The electrical adaptor as claimed in claim 5, further comprising a switch device assembled to the top side of the cover member and coupled to the sliding members.

7. The electrical adaptor as claimed in claim 6, wherein the switch device includes a button member received in a cavity defined in the top side of the cover member and a connection member accommodated in the cover member and linking the sliding members and the button member.

8. The electrical adaptor as claimed in claim 7, wherein the button member includes a pushing portion accommodated in the cavity and a post portion extending downwardly from the pushing portion and protruding into an interior of the cover member via a slot communicating with the cavity and the interior of the cover member.

9. The electrical adaptor as claimed in claim 8, wherein the connection member has a frame portion and a post integral with the frame portion, the frame portion defines two holes in a front and rear segments thereof to receive protrusions formed on the sliding members, and the post defines a hole to accommodate the post portion of the button member.

10. The electrical adaptor as claimed in claim 1, wherein the cover member includes an upper cover and a bottom cover.

11. The electrical adaptor as claimed in claim 10, wherein the upper cover and the bottom cover each have two recesses defined in the lateral sides thereof and aligned with one another along a vertical direction, and wherein the rotational wheels of the first and second variable resistors project outwardly of the cover member via the recesses.

12. The electrical adaptor as claimed in claim 11, wherein two supporters are respectively arranged in the internal of the bottom and upper covers and disposed adjacent the recesses, and wherein the rotational wheels of the first and second variable resistors respectively ride against the two supporters.

13. An dual port adaptor comprising:
a case defining a receiving space and defining two opposite ends along a front-to-back direction and a middle levels in a vertical direction perpendicular to said front-to-back direction;
a single port located at one end of the case for input;
a dual-port located at the other end of the case for output;
a pair of printed circuit boards being received in the receiving space and spaced from each other in said vertical direction;
a pair of rotatable wheels located respectively at said middle level in said vertical direction and partially exposed respectively outside two opposite lateral faces of the case in a lateral direction perpendicular to said front-to-back direction and said vertical direction so as to easily allow the user to adjust corresponding resistors which are respectively located inside the case at said middle level and respectively mounted upon the printed circuit boards and respectively linked to the corresponding rotatable wheels; wherein
the printed circuit board is offset from the corresponding rotatable wheel in said vertical direction; wherein said printed circuit board set includes two discrete printed circuit boards, and each of said resistors are mounted on said two discrete printed circuit boards, respectively; wherein each of the printed circuit board is offset, in said lateral direction, from the rotatable wheel which is mounted on the other printed circuit board.

14. The dual port adaptor as claimed in claim 13, wherein each of the resistors is mounted on a surface of the corresponding printed circuit board, direction facing the casing in the vertical direction.

* * * * *